(12) United States Patent
Madni

(10) Patent No.: US 6,538,501 B2
(45) Date of Patent: Mar. 25, 2003

(54) RADIO FREQUENCY AMPLIFIER AND TUNER

(75) Inventor: Arshad Madni, Swindon (GB)

(73) Assignee: Zarlink Semiconductor Limited (GB)

( * ) Notice: Subject to any disclaimer, the term of this patent is extended or adjusted under 35 U.S.C. 154(b) by 0 days.

(21) Appl. No.: 09/852,600

(22) Filed: May 10, 2001

(65) Prior Publication Data

US 2001/0050587 A1 Dec. 13, 2001

(30) Foreign Application Priority Data

May 12, 2000 (GB) .............................................. 0011334

(51) Int. Cl.[7] ................................................. G06G 7/26
(52) U.S. Cl. ....................................... 327/563; 330/261
(58) Field of Search .............................. 327/65, 67, 77, 327/89, 560–563; 330/252, 253, 261

(56) References Cited

U.S. PATENT DOCUMENTS 4,300,102 A * 11/1981 Inoue ........................... 330/254
5,541,538 A * 7/1996 Bacrania et al. ............... 327/77
5,952,880 A * 9/1999 Voorman et al. ............. 327/359

FOREIGN PATENT DOCUMENTS

GB 2 295 934 A 6/1996

* cited by examiner

Primary Examiner—Kenneth B. Wells
(74) Attorney, Agent, or Firm—Thompson Hine LLP

(57) ABSTRACT

A radio frequency amplifier includes first and second transconductance stages 20, 21, the product of whose transconductances is negative. The input and output of the first stage form the input and output of the amplifier. The output of the first stage is provided with a load 22 whereas the output of the second stage 21 is provided with a load 23 and is fed back to the input of the first stage.

15 Claims, 6 Drawing Sheets

RADIO FREQUENCY AMPLIFIER AND TUNER

BACKGROUND OF THE INVENTION

1. Field of the Invention

The present invention relates to a radio frequency amplifier. Such an amplifier may be used in a tuner, for example as an input stage or as part of a mixer of a superheterodyne tuner. The present invention also relates to a tuner including such an amplifier.

2. Description of the Prior Art

In radio frequency tuners, it is desirable to have an input stage which provides good input impedance matching from DC to several GHz while keeping the noise figure to a minimum. It is common for tuners to be implemented partially or wholly as integrated circuits and the power dissipation must be maintained sufficiently low in order for such integrated circuits to be formed in relatively cheap packages so as to make such devices economically viable. The requirement to maintain relatively low power dissipation generally conflicts with the requirements of good signal handling and low noise figure.

In order to provide a well-defined input impedance, a series shunt feedback arrangement of the type illustrated in FIG. 1 of the accompanying drawing has been widely used. In particular, this type of radio frequency amplifier or input stage of a tuner comprises an amplifier 1 having a gain of −A and a shunt feedback resistor 2 having a value Rf. The input impedance Rin of the stage is then given by the expression:

$$Rin = Rf/(1+A)$$

so that the input impedance can effectively be selected, within limits, by the choice of the value Rf of the resistor 2.

An arrangement of this type is illustrated in more detail in FIG. 2 of the accompanying drawings. The input of the stage is connected to the input of a transconductance stage 3 having a transconductance −gm. The output of the transconductance stage 3 is supplied to a buffer 4 having a gain of unity. The output of the stage 3 is also provided with a load impedance illustrated as a resistor 5 connected to ground gnd. The signal at the input is thus amplified and inverted in phase by the transconductance stage 3 and the output voltage of the stage 3 is developed across the load 5. This is buffered by the buffer 4 before being supplied to the output of the stage and to the feedback resistor 2. The amplifier 1 of FIG. 1 is thus implemented as the transconductance stage 3, the load impedance 5 and the buffer 4 and the gain A is given by the product of the transconductance of the stage 3 and the value of the load 5.

FIG. 3 of the accompanying drawings illustrates a discrete circuit implementation of the amplifier illustrated in FIG. 2. The transconductance stage 3 comprises an npn transistor 6 connected in the common-emitter configuration with the collector being connected via the load resistor 5 to a supply line vcc. The emitter of the transistor 6 is connected via an emitter degeneration resistor 7 to ground gnd.

The buffer 4 comprises a transistor 8 connected as an emitter follower with its collector connected to the supply line vcc and its emitter connected to the output of the stage and via a constant current source 9 to ground gnd. The base of the transistor 8 is connected to the collector of the transistor 6 and the emitter of the transistor 8 is connected via the feedback resistor 2 to the base of the transistor 6. The transconductance of the stage 3 is given by 1/(Re+re), where Re is the value of the emitter resistor 7 and re is the diode impedance of the transistor 6.

The arrangement shown in FIG. 3 may be used as a low noise amplifier (LNA) as an input stage of a tuner for receiving radio frequency signals, for example from an aerial or cable distribution system.

The LNA shown in FIG. 3 may form part of a mixer and an arrangement of this type is illustrated in FIG. 4 of the accompanying drawings. In this arrangement, the output of the LNA is connected to another common-emitter transconductance stage comprising a transistor 10 provided with an emitter degeneration resistor 11. The collector of the transistor 10 is connected to a single-balanced Gilbert mixer comprising differential transistors 12 and 13 and a load resistor 14. The bases of the transistors 12 and 13 receive differential local oscillator signals Lo− and Lo+ and the intermediate frequency output is formed across the load resistor 14.

An alternative mixer arrangement is illustrated in FIG. 5 of the accompanying drawings. In this arrangement, the transconductance stage comprising the transistor 10 and the resistor 11 of FIG. 4 is omitted. Instead of connecting the collector resistor 5 to the supply line vcc, it is connected directly to the Gilbert mixer. Such an arrangement reduces the number of components of the mixer and provides a power-efficient arrangement. However, the maximum conversion gain is limited.

SUMMARY OF THE INVENTION

According to a first aspect of the invention, there is provided a radio frequency amplifier comprising: a first transconductance stage whose input forms the input of the amplifier and whose output forms the output of the amplifier and is connected to a first load impedance; and a second transconductance stage whose input is connected to the output of the first stage and whose output is connected to the input of the first stage and to a second load impedance, the product of the transconductances of the first and second stages being negative.

The first stage may comprise at least one transistor of a first conductivity type and the second stage may comprise at least one transistor of a second conductivity type opposite the first type. The transistors may be bipolar transistors or field effect transistors, such as metal oxide silicon field effect transistors.

The first stage may comprise a differential pair of first and second transistors. The emitters of the first and second transistors may be connected to a first constant current source via respective first emitter resistors. The collectors of the first and second transistors may be connected to the amplifier output via respective first collector resistors whose values are substantially equal to the values of the first emitter resistor.

The second stage may comprise a second differential pair of third and fourth transistors. The emitters of the third and fourth transistors may be connected to a second constant current source via respective second emitter resistors. The collectors of the third and fourth transistors may be connected to respective second collector resistors constituting the second load impedance.

The collectors of the first and second transistors may be connected to the bases of the third and fourth transistors, respectively, and the collectors of the third and fourth transistors may be connected to the bases of the second and first transistors, respectively.

The collectors of the first and second transistors may be connected to the emitters of third and fourth differential pairs of transistors, respectively, of the first conductivity type. The third differential pair may comprise fifth and sixth transistors and the fourth differential pair may comprises seventh and eighth transistors whose bases are connected to the bases of the fifth and sixth transistors, respectively, and whose collectors are connected to the collectors of the sixth and fifth transistors, respectively.

According to a second aspect of the invention, there is provided a tuner including an amplifier according to the first aspect of the invention.

It is thus possible to provide an amplifier having an improved noise figure. This may be achieved while maintaining a relatively low power dissipation and a well-defined input impedance. The amplifier may be formed in a relatively low cost integrated circuit package.

BRIEF DESCRIPTION OF THE DRAWINGS

The invention will be further described, by way of example, with reference to the accompanying drawings, in which.

DESCRIPTION OF THE PREFERRED EMBODIMENTS

Figure 1:
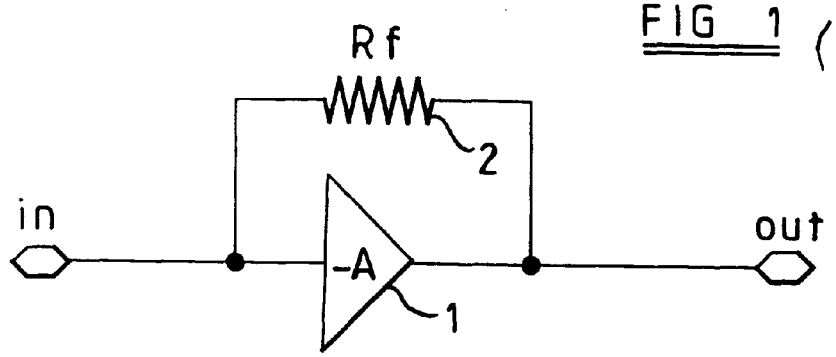
FIG. 1 is a schematic diagram of a known type of LNA.
Figure 2:
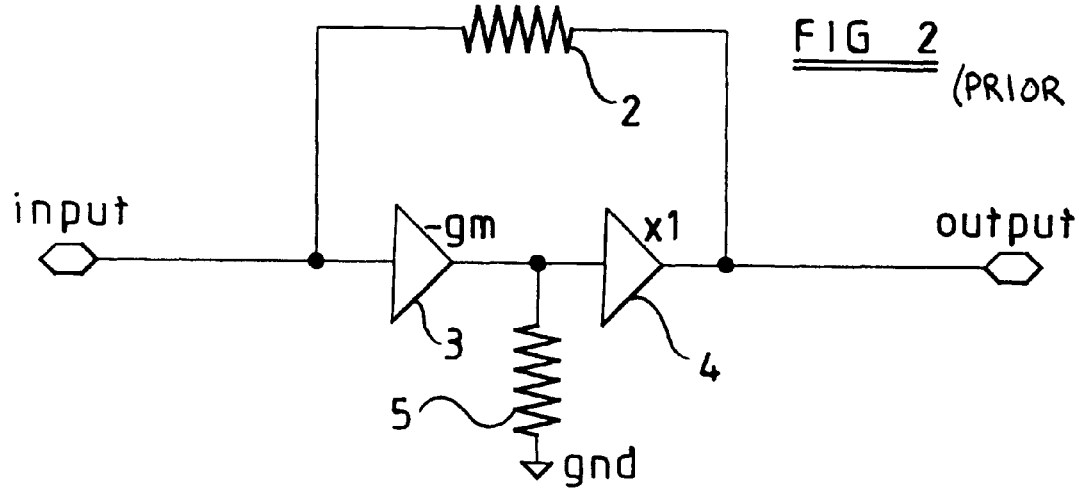
FIG. 2 is a more detailed block diagram of the LNA of FIG. 1.
Figure 3:
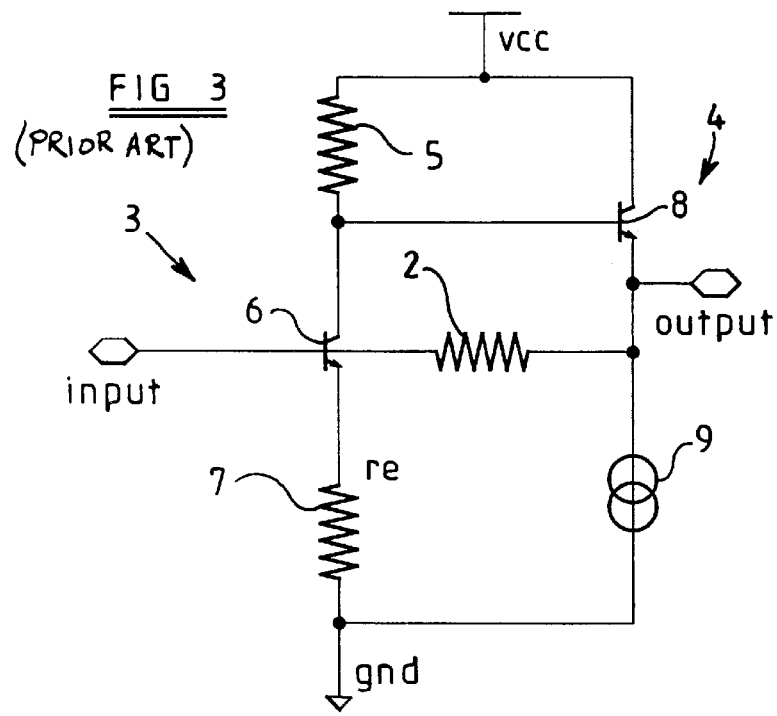
FIG. 3 is a circuit diagram of the LNA of FIG. 2.
Figure 4:
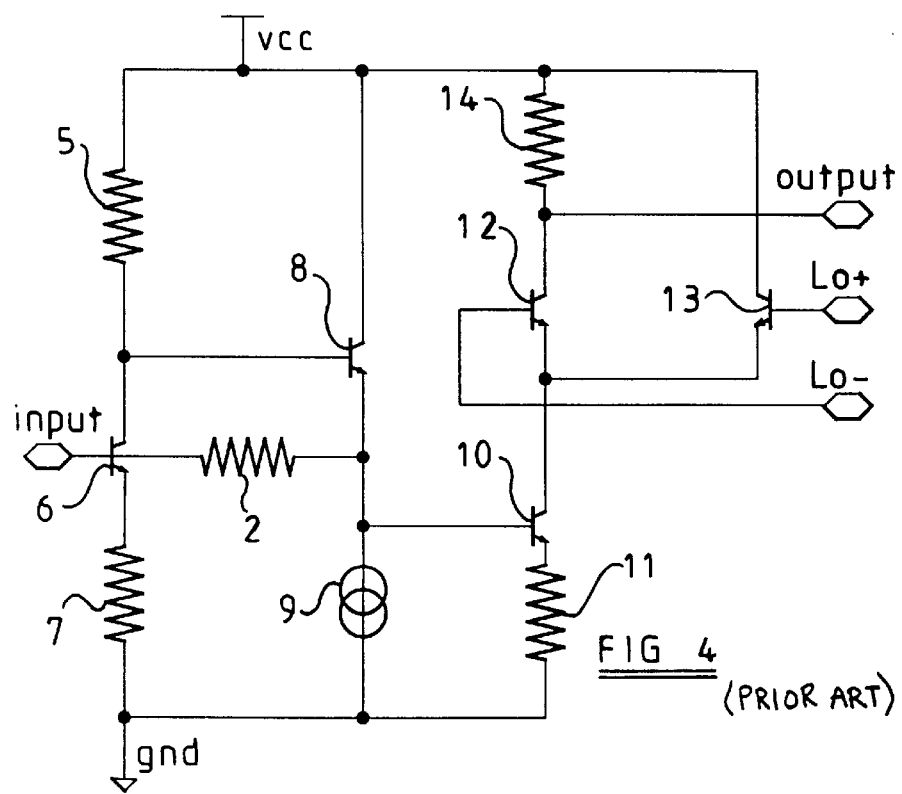
FIG. 4 is a circuit diagram illustrating a known arrangement of an LNA of the type shown in FIG. 3 forming part of a mixer.
Figure 5:
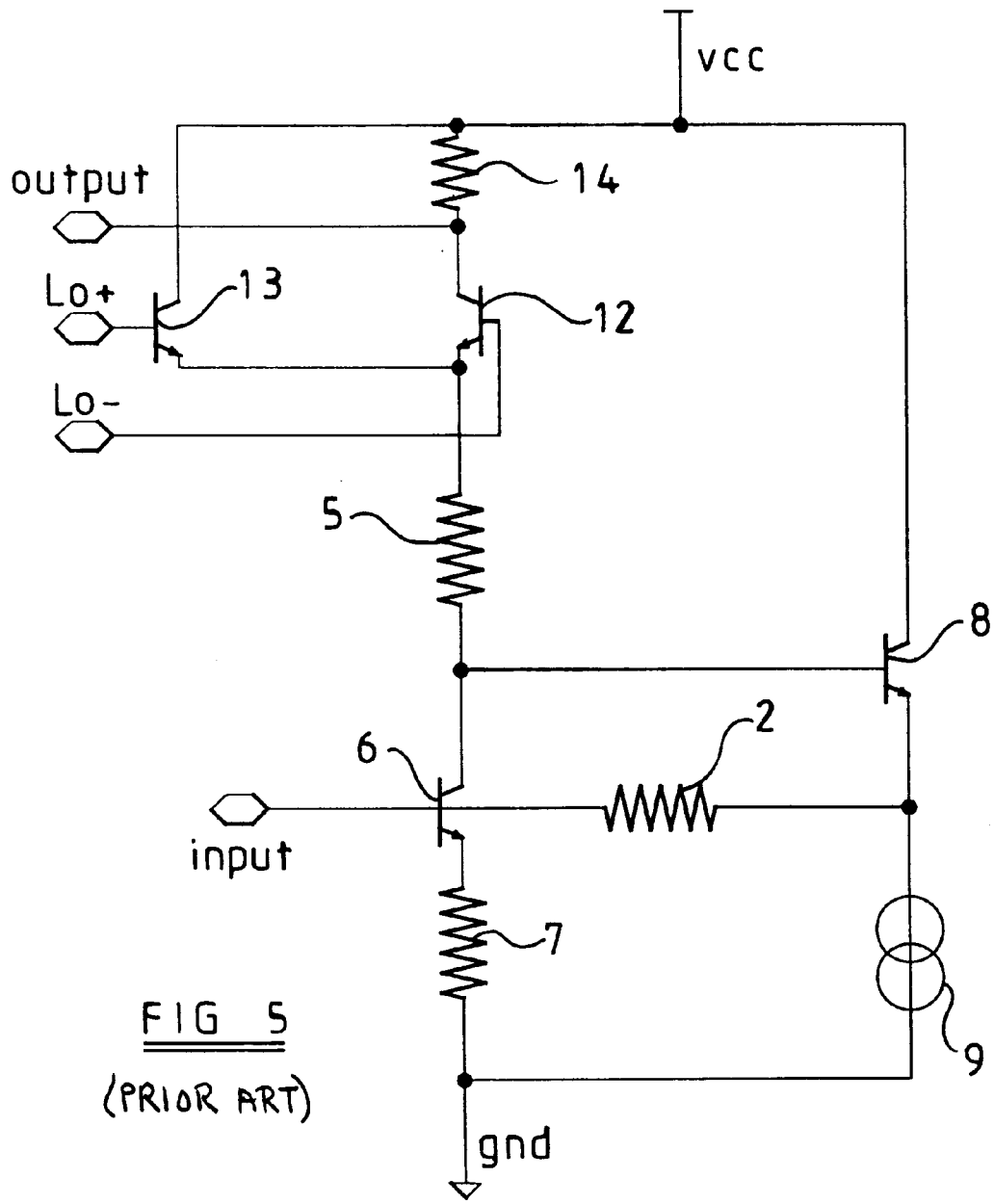
FIG. 5 is a circuit diagram of another known arrangement of mixer.
Figure 6:
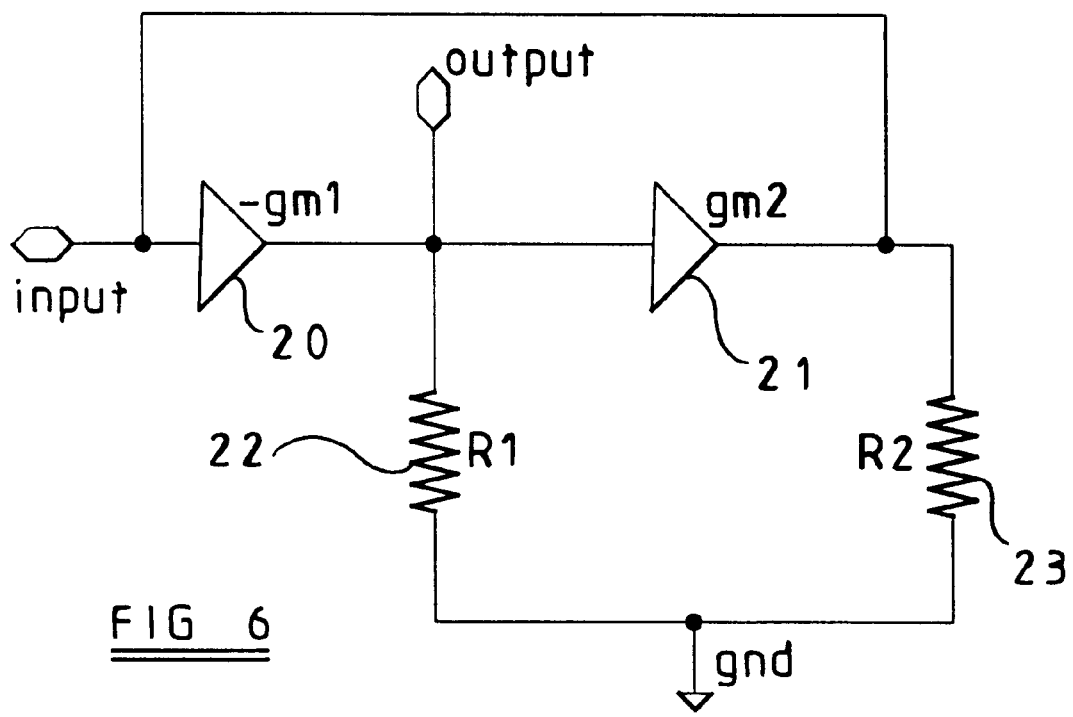
FIG. 6 is a block schematic diagram of a radio frequency amplifier constituting an embodiment of the invention.

The radio frequency amplifier shown in FIG. 6 comprises a first transconductance stage 20 connected in cascade with a second transconductance stage 21. The first stage 20 has an input and output forming the input and output of the radio frequency amplifier. The first transconductance stage 20 has a negative transconductance –gm1 whereas the second stage 21 has a transconductance gm2 so that the product of the transconductances is negative and the signals at the outputs of the stages 20 and 21 are inverted with respect to the input signal. The first stage 20 is provided with a load impedance 22 illustrated as a resistor of value R1 whereas the second stage 21 is provided with a load impedance 23 illustrated as a resistance of value R2. The common ends of the load impedances 22 and 23 are illustrated as being connected to ground gnd but other connections are possible as illustrated hereinafter. The input impedance Rin of the amplifier shown in FIG. 6 is given by:

$$Rin = \frac{R1}{1 + gm1 \cdot R1 \cdot gm2 \cdot R2}$$

This arrangement allows a larger value R1 of the load impedance 22 to be used to achieve a given desired input impedance. This improves the noise figure of the amplifier.

Figure 7:
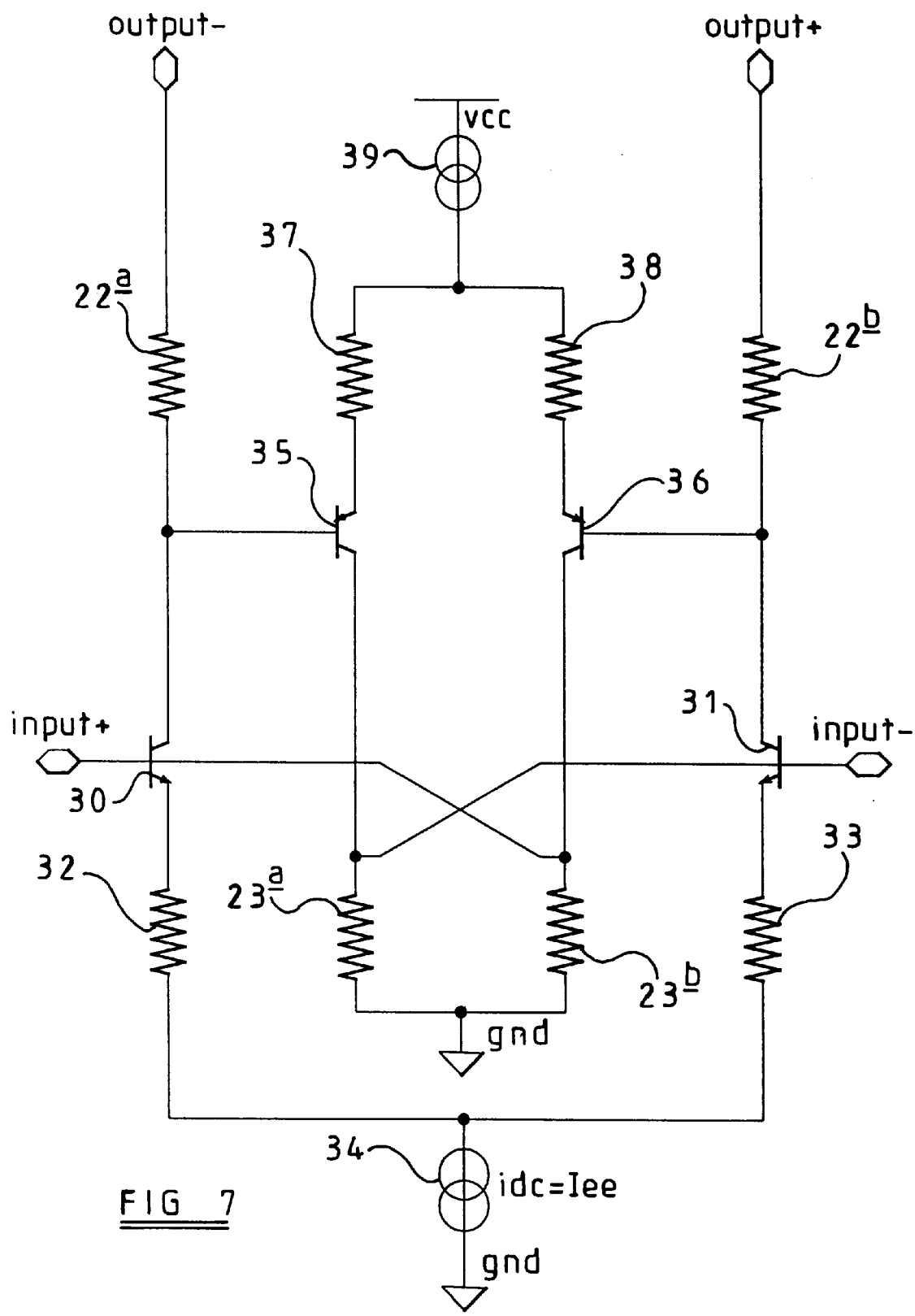
FIG. 7 is a circuit diagram of the amplifier of FIG. 6.

A highly power-efficient arrangement may be provided by implementing the amplifier of FIG. 6 in complementary bipolar technology and such an arrangement is illustrated in FIG. 7. The first transconductance stage 20 comprises npn transistors 30 and 31 connected as a differential pair with emitter degeneration resistors 32 and 33 connected to a constant current source 34. The amplifier thus has differential inputs "input+" and "input–". The collectors of the transistors are connected via resistors 22a and 22b, which are equivalent to the load impedance 22 of FIG. 6, to differential outputs "output–" and "output+" of the amplifier.

The second transconductance stage 21 comprises pnp transistors 35 and 36 connected as a differential pair and provided with emitter resistors 37 and 38 connected to a constant current source 39. The bases of the transistor 35 and 36 are connected to the collectors of the transistors 30 and 31, respectively, whereas the collectors of the transistors 35 and 36 are connected to the bases of the transistors 31 and 30, respectively, so that the first stage is inverting whereas the second stage is non-inverting. The constant current source 39 is connected to a supply line vcc whereas the collectors of the transistors 35 and 36 are connected to ground via resistors 23a and 23b which are equivalent to the load impedance 23 of FIG. 6.

The amplifier may also be implemented in field effect transistor technology, for example with the transistors 30 and 31 comprising metal oxide silicon field effect transistors (MOSFETs) of one conductivity type and the transistors 35 and 36 comprising MOSFETs of the opposite conductivity type.

Figure 8:
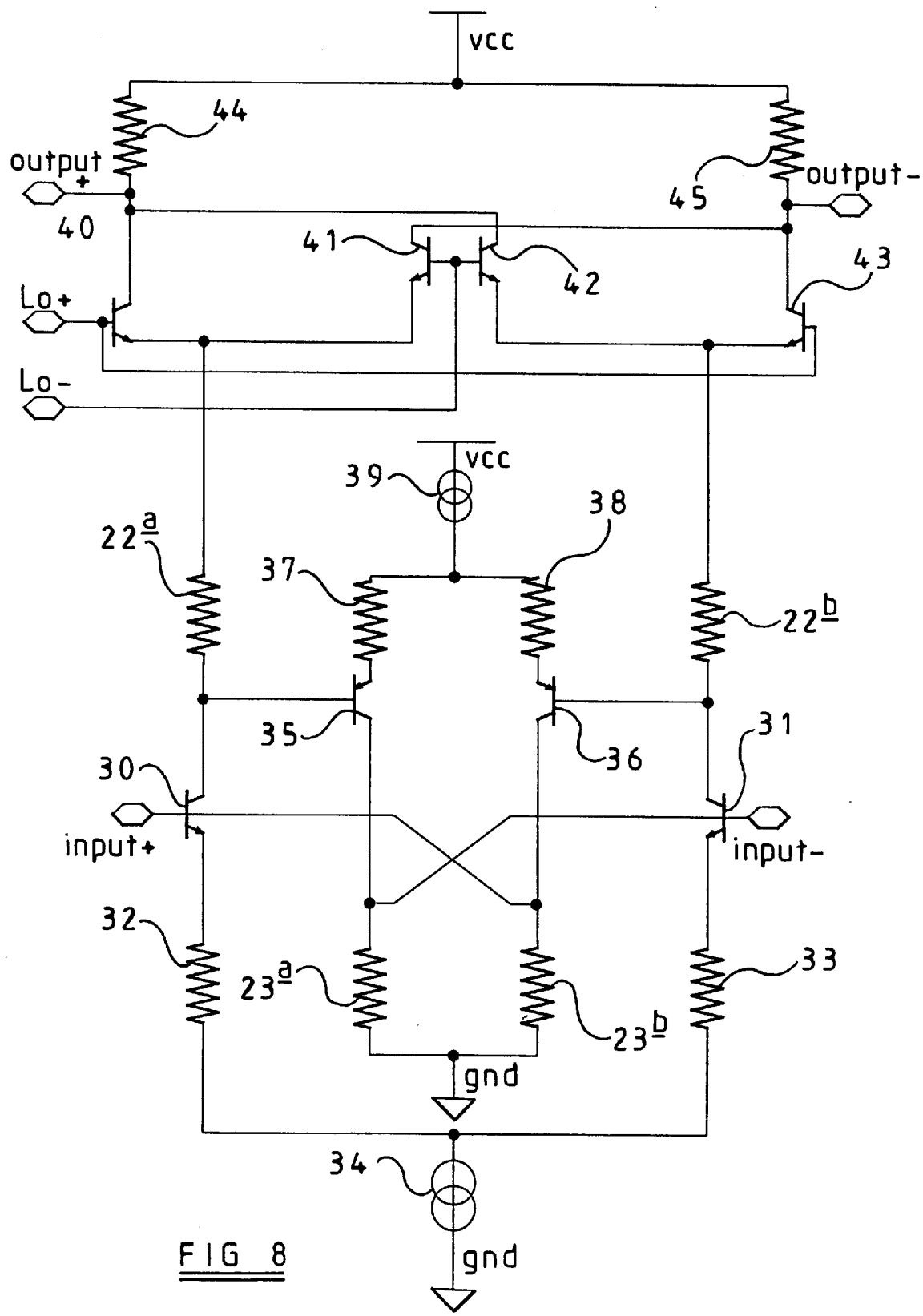
FIG. 8 is a circuit diagram illustrating use of the amplifier of FIG. 7 as part of a mixer.

The amplifier shown in FIG. 7 may form part of a mixer input stage as shown in FIG. 8. The differential outputs of the amplifier are connected to a double-balanced Gilbert mixer comprising npn transistors 40 to 43 and resistors 44 and 45. The transistors 40 and 41 form a differential pair whose emitters are connected to the resistor 22a whereas the transistors 42 and 43 form a differential pair whose emitters are connected to the resistor 22b. The bases of the transistors 41 and 42 are connected to an inverting local oscillator input Lo– whereas the bases of the transistors 40 and 43 are connected to a non-inverting local oscillator input Lo+. The collectors of the transistors 40 and 42 are connected to a first mixer output "output+" and via the resistor 44 to the supply line vcc. The collectors of the transistors 41 and 43 are connected to a second mixer output "output–" and via the resistor 45 to the supply line vcc.

In order to optimise the performance of the mixer, the resistance of each of the emitter resistors 32 and 33 is made equal to the resistance of each of the load resistors 22a and 22b so that the voltage gain of the first stage of the mixer is unity so as to optimise the overall conversion gain of the mixer. The performance of the second transconductance stage may be optimised by choosing the current supplied by the constant current source 39, for example by simulation of the transient performance of the circuit, so as to provide the lowest achievable intermodulation products. It is thus possible to provide a mixer having a very good IIP3 performance.

Although the arrangement illustrated in FIG. 8 is described for use as a mixer with differential local oscillator signals supplied to the inputs Lo+ and Lo–, the same circuit arrangement may be used to provide a radio frequency amplifier with automatic gain control. In such an arrangement, the inputs Lo+ and Lo– are connected to receive differential control voltages generated elsewhere in a tuner of which the circuit is a part so as to maintain the tuner output signal amplitude before demodulation substantially constant and independent of the radio, frequency input signal level (within the operating range of the automatic gain control arrangement).

What is claimed is:

1. A radio frequency amplifier having an input and an output and comprising: a first load impedance; a second load impedance; a first transconductance stage having an input which forms said input of said amplifier, an output which forms said output of said amplifier and is connected to said first load impedance, and a first transconductance; and a second transconductance stage having an input which is connected to said output of said first stage, an output which is connected to said input of said first stage and to said second load impedance, and a second transconductance, a product of said first and second transconductances being negative.

2. An amplifier as claimed in claim 1, in which said first stage comprises at least one transistor of a first conductivity type and said second stage comprises at least one transistor of a second conductivity type opposite said first type.

3. An amplifier as claimed in claim 2, in which said first stage comprises a first differential pair of first and second transistors.

4. An amplifier as claimed in claim 3, comprising a first constant current source and first emitter resistors, wherein said first and second transistors have emitters connected to said first constant current source via respective ones of said first emitter resistors.

5. An amplifier as claimed in claim 4, comprising first collector resistors, wherein said first and second transistors have collectors connected to said amplifier output via respective ones of said first collector resistors, each of which has a value substantially equal to a value of each of said first emitter resistors.

6. An amplifier as claimed in claim 2, in which said second stage comprises a second differential pair of third and fourth transistors.

7. An amplifier as claimed in claim 6, comprising a second constant current source and second emitter resistors, wherein said third and fourth transistors have emitters connected to said second constant current source via respective ones of said second emitter resistors.

8. An amplifier as claimed in claim 6, in which said second load impedance comprises second collector resistors and said third and fourth transistors have collectors connected to respective ones of said second collector resistors.

9. An amplifier as claimed in claim 3, in which said second stage comprises a second differential pair of third and fourth transistors, each of said first to fourth transistors has a base and a collector, said collectors of said first and second transistors are connected to said bases of said third and fourth transistors, respectively, and said collectors of said third and fourth transistors are connected to said bases of said second and first transistors, respectively.

10. An amplifier as claimed in claim 3, comprising third and fourth differential pairs of transistors of said first conductivity type having emitters, said first transistor having a collector connected to said emitters of said third differential pair of transistors and said second transistors having a collector connected to said emitters of said fourth differential pair of transistors.

11. An amplifier as claimed in claim 10, in which said third differential pair comprises fifth and sixth transistors, the fourth differential pair comprises seventh and eighth transistors, each of said fifth to eighth transistors has a base and a collector, said bases of said seventh and eighth transistors are connected to said bases of said fifth and sixth transistors, respectively, and said collectors of said seventh and eighth transistors are connected to said collectors of said sixth and fifth transistors, respectively.

12. The radio frequency amplifier of claim 1 wherein said output of said second stage is connected directly to said input of said first stage.

13. A tuner including a radio frequency amplifier having an input and an output and a first transconductance stage having an input which forms said input of said amplifier, an output which forms said output of said amplifier and is connected to a first load impedance, and a first transconductance; and a second transconductance stage having an input which is connected to said output of said first stage, an output which is connected to said input of said first stage and to a second load impedance, and a second transconductance, a product of said first and second transconductances being negative.

14. A radio frequency amplifier having an input and an output and comprising: a first load impedance; a second load impedance; a first transconductance stage having an input which forms said input of said amplifier and which receives a radio frequency signal to be amplified, an output which forms said output of said amplifier, and a first transconductance; and a second transconductance stage having an input which is connected to said output of said first stage, an output which is connected to said input of said first stage and to said second load impedance, and a second transconductance, a product of said first and second transconductances being negative.

15. The radio frequency amplifier of claim 14 wherein said output of said second stage is connected directly to said input of said first stage.

* * * * *